(12) United States Patent
Le Gallou et al.

(10) Patent No.: US 8,669,811 B2
(45) Date of Patent: Mar. 11, 2014

(54) RADIO-FREQUENCY POWER AMPLIFIER WITH FAST ENVELOPE TRACKING

(75) Inventors: Nicolas Le Gallou, Sassenheim (NL); Christophe Delepaut, Katwijk (NL); David Sardin, Ceyreste (FR); Michel Campovecchio, Limoges (FR)

(73) Assignee: Agence Spatiale Europeenne, Paris (FR)

( * ) Notice: Subject to any disclaimer, the term of this patent is extended or adjusted under 35 U.S.C. 154(b) by 64 days.

(21) Appl. No.: 13/231,133

(22) Filed: Sep. 13, 2011

(65) Prior Publication Data

US 2012/0062323 A1    Mar. 15, 2012

(30) Foreign Application Priority Data

Sep. 15, 2010 (EP) .................................. 10290490

(51) Int. Cl.
H03G 3/20 (2006.01)
H03F 3/04 (2006.01)
H03F 1/02 (2006.01)

(52) U.S. Cl.
CPC .................................. H03F 1/0222 (2013.01)
USPC .......................................... 330/136; 330/297

(58) Field of Classification Search
USPC .............................. 330/136, 297, 10
See application file for complete search history.

(56) References Cited

U.S. PATENT DOCUMENTS

| | | | |
|---|---|---|---|
| 3,559,087 A * | 1/1971 | Goordman et al. | 330/255 |
| 5,880,633 A | 3/1999 | Leizerovich et al. | |
| 6,175,273 B1 | 1/2001 | Sigmon et al. | |
| 6,665,525 B2 * | 12/2003 | Dent et al. | 455/108 |
| 2005/0008093 A1 | 1/2005 | Matsuura et al. | |
| 2005/0110565 A1 | 5/2005 | Robinson | |
| 2006/0061416 A1 * | 3/2006 | Kusunoki | 330/10 |
| 2008/0111631 A1 | 5/2008 | Shiikuma | |

FOREIGN PATENT DOCUMENTS

WO    WO 01/22572 A1    3/2001
WO    WO 2004/112239 A1    12/2004

OTHER PUBLICATIONS

Search Report from European Application No. EP 10 29 0490, filed Sep. 15, 2010.
Vipindas Papa et al: "Application of GaAs pHEMT technology for efficient high-frequency switching regulators", Power Semiconductor Devices&IC's (ISPSD), 2010 $22^{nd}$ Internationl Symposium on, IEEE, Piscataway, NJ, USA; Jun. 6, 2010, pp. 65-68; XP031729141.

(Continued)

*Primary Examiner* — Robert Pascal
*Assistant Examiner* — Khiem Nguyen
(74) *Attorney, Agent, or Firm* — Alston & Bird LLP

(57) ABSTRACT

A radio-frequency power amplifier with envelope tracking, comprising: a power RF amplifying device for amplifying a RF signal; and a switching DC/DC converter, comprising a switching device and a rectifying device, for providing said power RF amplifying device with a DC power supply at a voltage level proportional to an envelope of said RF signal; wherein said switching device is a RF power transistor; characterized in that said rectifying device, and preferably also said power RF amplifying device, is also a transistor of a same technology, connected as a two-terminal device. Preferably, said power RF amplifying device is also a transistor of said same technology. A low-pass filter can also be provided for reducing the bandwidth of the envelope signal on which the PWM signal driving the DC/DC converter depends.

11 Claims, 9 Drawing Sheets

(56) References Cited

OTHER PUBLICATIONS

Musunuri S et al: "Optimization issues for fully-integrated CMOS DC-DC converters", Conference Record of the 2002 IEEE Industry Applications Conference: 37$^{th}$ IAS Annual Meeting; Oct. 13-18, 2002, Pittsburgh, Pennsyvlvania, USA; [Conference Record of the IEEE Industry Applications Conference. IAS Annual Meeting], IEEE Service CE, vol. 4, Oct. 13, 2002, pp. 2405-2410, XP010609925.

Jinseong Jeong et al: "High-Efficiency WCDMA Envelope Tracking Base-Station Amplifier Implemented With GaAs HVHBTs"; IEEE Journal of Solid-State Circuits, IEEE Service Center, Piscataway, NJ, USA, vol. 44, No. 10; Oct. 10, 2009, pp. 2629-2639, XP011276914.

Dhawan, S et al: "Commercial Buck Converters and Custom Coil Development for the Atlas Inner Detector Upgrade", IEEE Transactions on Nuclear Science, IEEE Service Center, New York, NY, US; vol. 57, No. 2; Apr. 1, 2010; pp. 456-462; XP011307391.

Hashimoto T et al: "System in Package (SiP) With Reduced Parasitic Inductance for Future Voltage Regulator", IEEE Transactions on Power Electronics, IEEE Service Center, Piscataway, NJ, US; vol. 24, No. 6, Jun. 1, 2009; pp. 1547-1553; XP011262077.

Draxler, P. Lanfranco, S. Kimball, D. Hsia, C. Jeong, J. Van De Sluis, J. Asbeck, P.M., "High Efficiency Envelope Tracking LDMOS Power Amplifier for W-CDMA", Microwave Symposium Digest, 2006. IEEE MTT-S International, 2006.

\* cited by examiner

RADIO-FREQUENCY POWER AMPLIFIER WITH FAST ENVELOPE TRACKING

FIELD OF THE INVENTION

The invention relates to a radio-frequency power amplifier with envelope tracking, in particular for use in space telecommunications and/or cellular networks.

BACKGROUND

Improving the efficiency, consumption, dissipation and/or linearity of radio-frequency (RF) solid state power amplifiers is a high priority for manufacturers of ground mobile telephony network infrastructures due to the very demanding requirements for 3G-UMTS. The very high linearity required dramatically impacts the efficiency of power amplifiers used in base-stations. Similar requirements arise in space applications.

It is well-known; however, that linearity and energetic efficiency are somehow contradictory requirements.

The "flexible amplifier" concept consists in adjusting the power supply to the average RF power in order to achieve both high linearity and high efficiency. "Envelope tracking" is an evolution of this approach, wherein the power supply is adjusted in a dynamical way, following the RF signal envelope.

FIG. 1 illustrates the conceptual scheme of a RF power amplifier with envelope tracking. $S_{RF}(t)$ is an input RF signal (S-band, i.e. 2 to 4 GHz) with a bandwidth of e.g. 36 MHz which enters the amplifier. This signal is split into two components $S_{RF}^1(t)$ and $S_{RF}^2(t)$ by input coupler ICP. Envelope detector ED extracts the envelope E(t) from signal $S_{RF}^1(t)$. The envelope signal E(t) drives a DC/DC converter DCC (linear and/or switching) which provides the high-power RF amplifier HPA with a time-varying power supply at voltage $V_0(t)$. Signal $S_{RF}^2(t)$ enters the high-power RF amplifier HPA to be amplified. Delay line DL introduces an adjustable delay τ in order to ensure that $S_{RF}^2(t-\tau)$ and E(t) are synchronized so that, at any time, the power supply is adjusted to the amplitude of the RF signal to be amplified. The amplified output signal is indicated by reference $S_{out}(t)$.

The main difficulty of the scheme of FIG. 1 resides in the implementation of the DC/DC converter. Linear converters are penalized by their low efficiency. On the other hand, the use of switching converters requires operating a power switch at a very high frequency—10 to 80 MHz for an envelope bandwidth of 5-10 MHz. Conventional Buck and Boost switching circuits, based on Si MOSFET, operate at much lower frequencies, typically around 100 kHz; operating them at a frequency of several MHz would introduce unacceptable switching losses.

For this reason it has been suggested to use a combination of a switching converter and a linear converter. The switching converter operates at a comparatively low frequency, and cannot follow the fast variations of the envelope, but it provides an average power supply with a high efficiency. The linear converter is less efficient but much faster, and assists the switching converter when the envelope changes at a fast rate. See e.g. Draxler, P. Lanfranco, S. Kimball, D. Hsia, C. Jeong, J. van de Sluis, J. Asbeck, P. M., "High Efficiency Envelope Tracking LDMOS Power Amplifier for W-CDMA", Microwave Symposium Digest, 2006. IEEE MTT-S International, 2006.

European patent EP1214780 discloses a RF power amplifier wherein envelope tracking is achieved by switching from different individual power supplies at different DC levels. This implies additional complex circuitry and additional power lines, and therefore an increase of the weight and cost of the apparatus, which is detrimental especially for space applications.

U.S. Patent Application US 2008/111631 discloses a RF power amplifier wherein envelope tracking is provided by a simple, one-transistor, switching DC-DC converter providing a time-varying power supply to a one-transistor RF power amplifier. In order to achieve a sufficient envelope bandwidth, the transistor of the DC-DC converter is indeed a RF power transistor. In a particular embodiment, the transistor of the DC-DC converter and that of the RF power amplifier are identical, discrete transistors embedded in a common package. In this apparatus, the bottleneck is constituted by the diode, which is also an essential part of the DC-DC converter. Indeed, commercially available power rectifiers, able to deal with currents greater or equal to 1 A and powers greater or equal to 10 W, can only operate at switching frequencies of a few kHz, or hundreds of kHz. Conversely, RF rectifiers operating at several MHz, tens of MHz or even GHz can only deal with low currents (in the range of mA) and low power (less than a few W).

Moreover, the apparatus of US 2008/111631 raises concerns regarding the high level of parasitic reactive elements. Indeed, while the two transistors used as RF amplifier and switch of the DC/DC converter are efficiently and compactly embedded in a single package, the wires connecting said transistors with the diode, capacitor and inductor of the converter introduce high parasitic capacitances and inductances reducing the performances of the switching cell.

SUMMARY

The invention aims at providing at solving the aforementioned drawbacks of the prior art.

According to the invention, this aim is achieved by a RF power amplifier wherein envelope tracking is provided by a fast DC/DC converter using two RF power transistors for implementing both the switching element and the rectifier of said DC/DC converter. Advantageously, these two transistors are of a same technology, which can preferably be the same as that of the transistor used for amplifying the RF signal. Unexpectedly, a RF power transistor connected as a rectifier allow achieving a high commutation speed (several MHz) while dealing with comparatively high currents (1 A or more) and powers (several Watts), which is not possible using commercially available diodes. Thus, the use of a transistor connected as a two-terminal device allows avoiding the "diode bottleneck" discussed in reference with prior art document US 2008/111631.

An object of the present invention is then a radio-frequency power amplifier with envelope tracking, comprising: a power RF amplifying device for amplifying a RF signal; and a switching DC/DC converter, comprising a switching device and a rectifying device, for providing said power RF amplifying device with a DC power supply at a voltage level proportional to an envelope of said RF signal; wherein said switching device is a RF power transistor; characterized in that said rectifying device is also a transistor of a same technology, connected as a two-terminal device.

Advantageously, said switching device, said rectifying device and said power RF amplifying are all transistors of a same technology. In particular, they can be identical transistors.

In a particular embodiment of the invention, said power RF amplifying device, said switching device and said rectifying device can be high-electron mobility transistors (HEMT); in this case the gate of the transistor used as a switching device can be connected to a first terminal while the drain and source of said transistor can be connected together to a second terminal. More particularly, said power RF amplifying device, said switching device and said rectifying device can be Gallium Nitride (GaN) HEMT or Gallium Arsenide (GaAs) HEMT.

In an alternative embodiment of the invention, said power RF amplifying device, said switching device and said rectifying device can be Heterojunction Bipolar Transistors; in this case the base of the transistor used as a switching device can be connected to a first terminal while the collector and emitter of said transistor can be connected together to a second terminal.

In another alternative embodiment of the invention, said power RF amplifying device, said switching device and said rectifying device can be Laterally Diffused Metal Oxide Semiconductor transistors; in this case gate and source are connected together to form the first terminal and the drain represents the second terminal.

A radio-frequency power amplifier according to the invention can be implemented by a single microwave monolithic integrated circuit (MMIC), or in discrete form.

Monolithic integration is clearly facilitated by the use of active device (amplifying transistor, switch and rectifier) of a same technology. Moreover, this also allows a particularly compact assembly, minimizing parasitic component, in case a discrete implementation is preferred.

In addition since the MMIC process does not necessarily contain high power and fast diodes in its design kit (standard device layout provided by the foundry), the invention provides a mean to use the standard transistor cells provided by the foundry and connect them into two terminal devices to form the fast rectifier required for the envelope tracking amplifier application.

In a first embodiment of a discrete radio-frequency power amplifier according the invention, said switching device and rectifying device are transistors mounted on a metal base plate in electrical connection with their sources or emitters, said base plates being directly contacted with each other. This is adapted, in particular, to the case where the DC/DC converter is a step-down "buck" converter.

In a second embodiment of a discrete radio-frequency power amplifier according the invention, said switching device and rectifying device are transistors mounted on a metal base plate in electrical connection with their sources or emitters, said base plates being connected to each other trough a capacitor sandwiched between them. This is adapted, in particular, to the case where the DC/DC converter is a step-up converter of the "boost" family.

Said switching device and said rectifying device can in particular have a switching speed greater or equal than 5 MHz and be able to handle a current greater or equal than 1 A. This allows envelope tracking by the DC/DC alone, with a bandwidth of 1 MHz or more, preferably with a bandwidth of 10 MHz or more, and even more preferably with a bandwidth of 30 MHz or more, e.g. of the order of 36 MHz, which is satisfactory for most applications, without the need for an efficiency-lowering linear envelope tracking stage.

A radio-frequency power amplifier according to any of the preceding claims can further comprise a driving circuit for driving said switching device with a PWM signal representative of an envelope of the RF signal to be amplified. A low-pass filter can be provided for reducing the bandwidth of the envelope signal on which the PWM signal driving the DC/DC converter depends.

BRIEF DESCRIPTION OF THE DRAWINGS

Additional features and advantages of the present invention will become apparent from the subsequent description, taken in conjunction with the accompanying drawings, which show.

DETAILED DESCRIPTION

Figure 1:
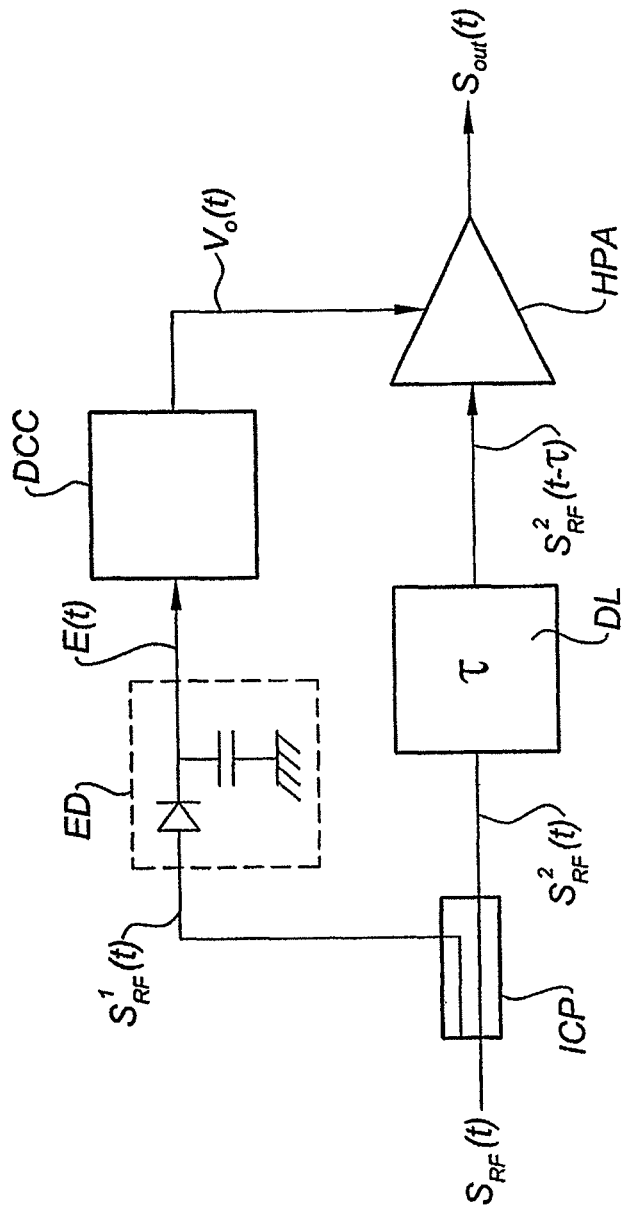
FIG. 1, the conceptual scheme of a RF power amplifier with envelope tracking.

FIG. 1, which has already been described, shows the conceptual scheme of a RF power amplifier with envelope tracking according to both the prior art and the invention.

Figure 2:
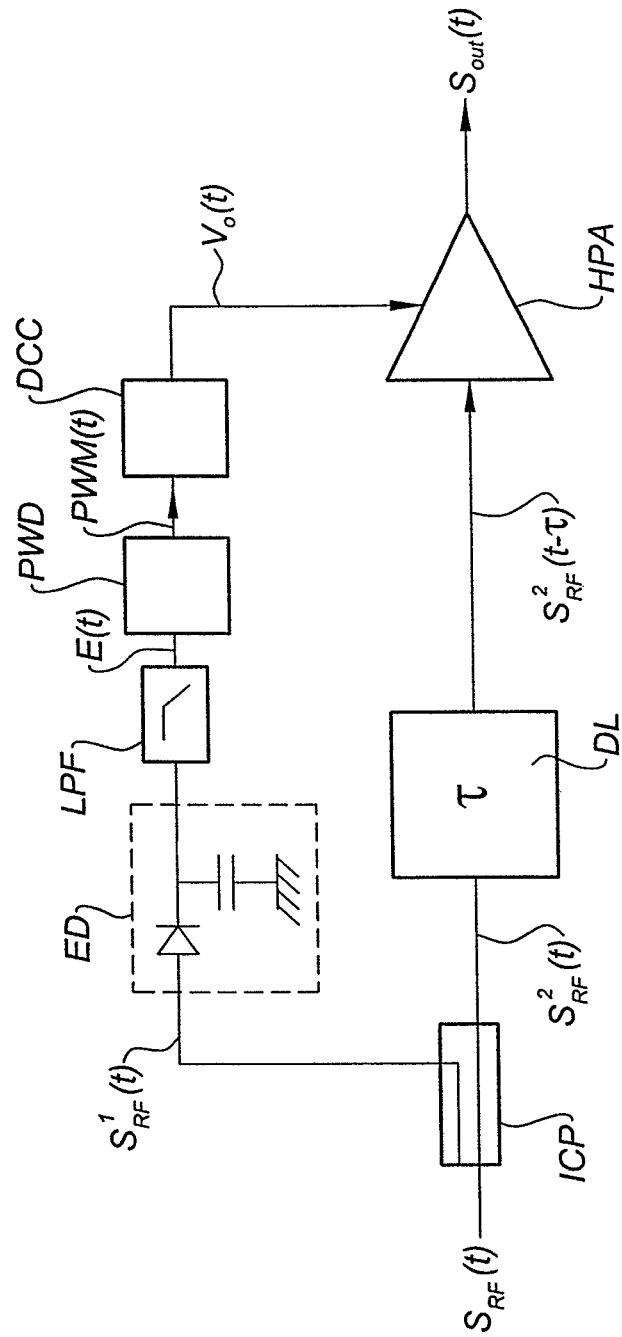
FIG. 2, the conceptual scheme of a RF power amplifier with envelope tracking according to the invention.

FIG. 2 shows the conceptual scheme of a RF power amplifier with envelope tracking according the invention. The tracking path comprises a low-pass filter LPF for reducing the bandwidth of the envelope signal E(t) (this point will be described in detail later, with reference to FIGS. 8A and 8B) and a pulse-width modulator driving circuit PWD for generating a pulse-width modulation signal PWM(t) proportional to the filtered envelope E(t). Said pulse-width modulation signal PWM(t) drives the DC/DC converter DCC, which is of the switching type, without any linear stage. It should be noted that the low pass filter and the delay line are optional components; applications exist where these components would not be necessary.

Figure 3:
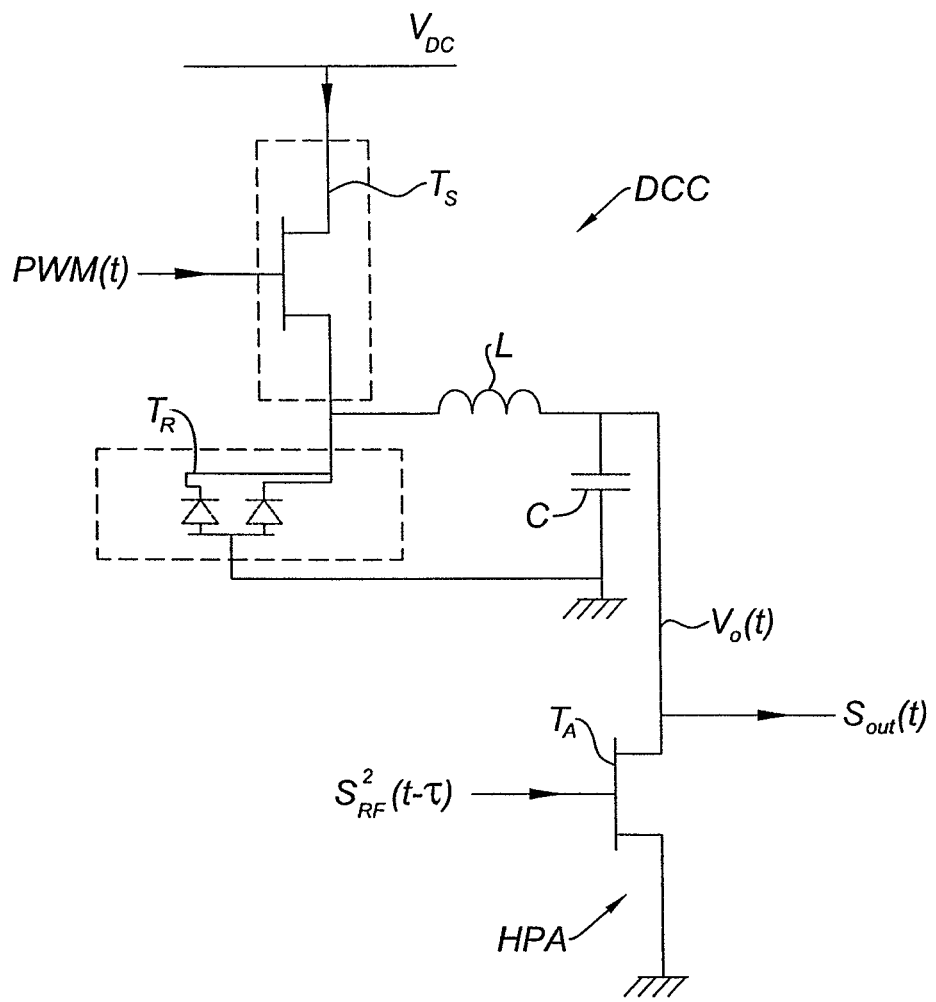
FIG. 3, the circuit diagram of an amplifier according to a first embodiment of the invention.

FIG. 3 shows the circuit diagram of a portion of a RF power amplifier with envelope tracking according to a first embodiment of the invention. More precisely, FIG. 3 only represents the DC/DC converter switching cell, of the "buck" type, comprising:

a switching transistor $T_S$, whose drain is connected to a main power supply $V_{DC}$ and whose gate is fed by a pulse-width modulation PWM(t) representative of the envelope E(t);

a "rectifying transistor" $T_R$, whose drain and source are connected together to the source of the switching transistor, while the gate is connected to the ground; the transistor connected this way operates as a free-wheeling diode whose anode is formed by the gate and the whose cathode is formed by the drain and source;

An inductor L and a capacitor C are connected to the source of the switching transistor $T_S$, forming an LC low-pass filter;

The DC signal $V_0(t)$ whose value (lower or equal to $V_{DC}$) is proportional to E(t)—with a certain time delay τ—is applied to the drain of the amplifying transistor $T_A$ which operates in common-source configuration and constitutes the hearth of the high-power amplifier HPA.

The delayed RF signal $S_{RF}^2(t)$ is applied to the gate of $T_S$ to be amplified; the amplified signal $S_0(t)$ is taken from the drain of $T_A$.

At least the transistors $T_S$ and $T_R$ constituting the buck switching cell are of a same technology, although they do not need to be identical; preferably, the amplifying transistor $T_A$ is also of the same technology. As non-limiting examples, the transistors $T_S$ and $T_R$ (and possibly $T_A$) can be HEMT, and more particularly GaN or GaAs HEMT. "HEMT" includes "conventional" HEMT as well as pseudomorphic HEMT (pHEMT) and metamorphic HEMT (mHEMT). Other RF power transistor can also be used, such as Heterojunction Bipolar Transistors (HBT), and in particular GaAs HBT, or laterally diffused metal oxide semiconductor transistors (LDMOS), in particular Si LDMOS.

If HBT are used, the rectifying transistor $T_R$ is connected exactly like the HEMT rectifying transistor $T_R$ of FIG. 3, the collector replacing the drain and the emitter the source. If LDMOS are used the connections between the transistor $T_R$ accesses are inverted due to an isolated gate. The drain constitutes still the cathode but the gate and source are now connected together to form the anode. This topology is illustrated on FIG. 9A. It is important to note that, in this case, the rectifying action is provided by a "reverse source to drain" diode of the LDMOS transistor. There is also a "forward drain to source" diode (not illustrated on the figure), which is anti-parallel to the reverse diode and represents the drain-to-source breakdown of the transistor. However, due to its high threshold voltage (of the order 60-100V or more), this diode remains in a non-conducting state and can be neglected in a first approximation.

The required speed of the switching cell is usually taken at least equal to 5 times the bandwidth of the envelope signal. As it will be discussed later, however, the envelope E(t) can be low-pass filtered without reducing too much the performances of the amplifier. For most applications, a switching speed comprised between 1 and 100 MHz will be sufficient. Advantageously the switching and rectifying transistor will have a switching speed greater or equal than 5 MHz (and preferably greater or equal than 10 MHz) and will be able to handle a current greater or equal than 1 A (and preferably greater or equal than 5 A).

Thanks to the use of RF transistors in the switching cell, however, much higher switching frequencies (up to several GHz) can be achieved if necessary.

The RF amplifier with envelope tracking can be integrated in MMIC technology, including the switching cell, the amplifier and also the (non-represented) pulse-width modulator driving the switching transistor $T_S$. The capacitor C and inductor L can also be integrated using standard MMIC technology passive libraries, for instance in MIM (Metal-Insulator-Metal) form for the capacitor C or in spiral form for the inductor L, using GaN, GaAs or Si technologies.

Figure 4A:
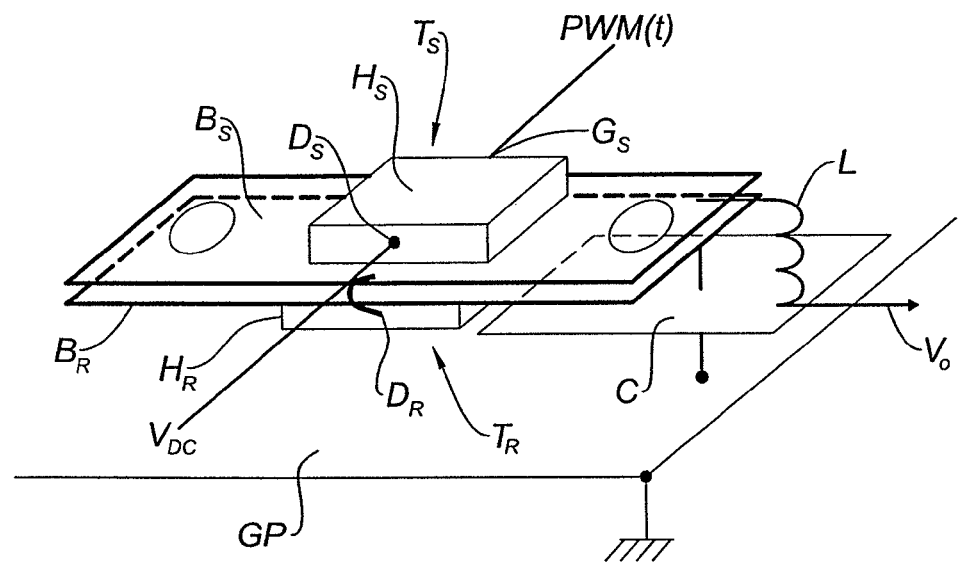
FIGS. 4A and 4B, two views of an exemplary discrete implementation of the amplifier of FIG. 2.

When discrete devices are used instead of a MMIC, the use of transistors $T_S$, $T_R$, and preferably also $T_A$, of a same technology (other than LDMOS) allows a particularly compact implementation of the switching cell, as illustrated on FIGS. 4A ("front view") and 4B ("back view"). In this embodiment, the switching transistor $T_S$ and the "rectifying transistor" $T_R$ are embedded into respective ceramic housings $H_S$, $H_R$ mounted on metallic (and therefore conductive) base plates $B_S$, $B_R$. References $D_S$, $D_R$ indicates the drain terminals of the transistors, and $G_S$, $G_R$ theirs gate terminals. Source terminals are connected to the base plates.

As illustrated on the figures, the two base plates are put in direct mechanical and electrical contact with each other; moreover the drain $D_R$ of the "rectifying transistor" $T_R$ and the inductor L are also connected to the base plates. The gate $G_R$ of the "rectifying transistor" $T_R$ is connected to a ground plane GP, and so is one terminal of capacitor C (the other terminal being connected to inductor L). The capacitor can be a ceramic RF capacitor. The compactness of this assembly is apparent.

Figure 5:
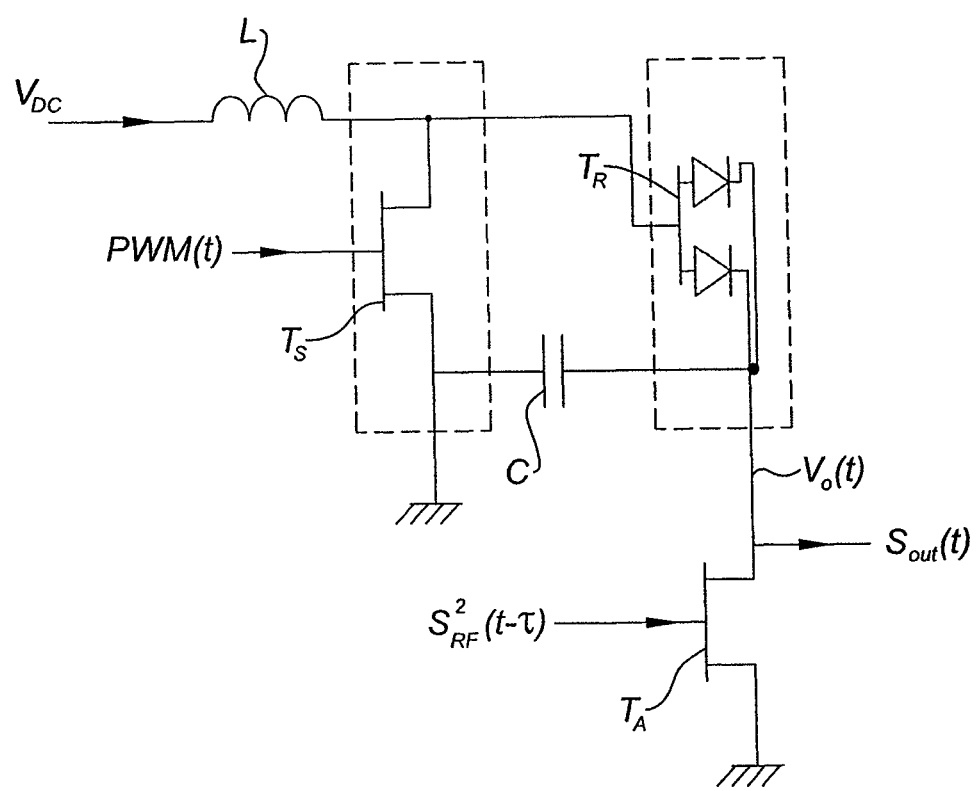
FIG. 5, the circuit diagram of an amplifier according to a second embodiment of the invention.

FIG. 5 shows the circuit diagram of a portion of a RF power amplifier with envelope tracking according to a second embodiment of the invention. More precisely, FIG. 5 only represents the switching cell of a "boost" DC/DC converter, comprising:

a switching transistor $T_S$, whose drain is connected to a main power supply $V_{DC}$ through inductor L, and whose gate is fed by pulse-width modulation PWM(t);

a "rectifying transistor" $T_R$, whose gate is connected to the drain of the switching transistor, while the drain and source are connected together to capacitor C, which in turn is connected to the source of $T_S$ and the ground. The transistor $T_R$ connected this way operates as a free-wheeling diode whose anode is formed by the gate and the whose cathode is formed by the drain and source;

The DC signal $V_0(t)$—higher or equal to $V_{DC}$—is applied to the drain of the amplifying transistor $T_A$ which operates in common-source configuration and constitutes the hearth of the high-power amplifier HPA. The delayed RF signal $S_{RF}^2(t-\tau)$ is applied to the gate of $T_A$ to be amplified; the amplified signal $S_0(t)$ is taken from the drain of $T_A$.

Figure 4B:
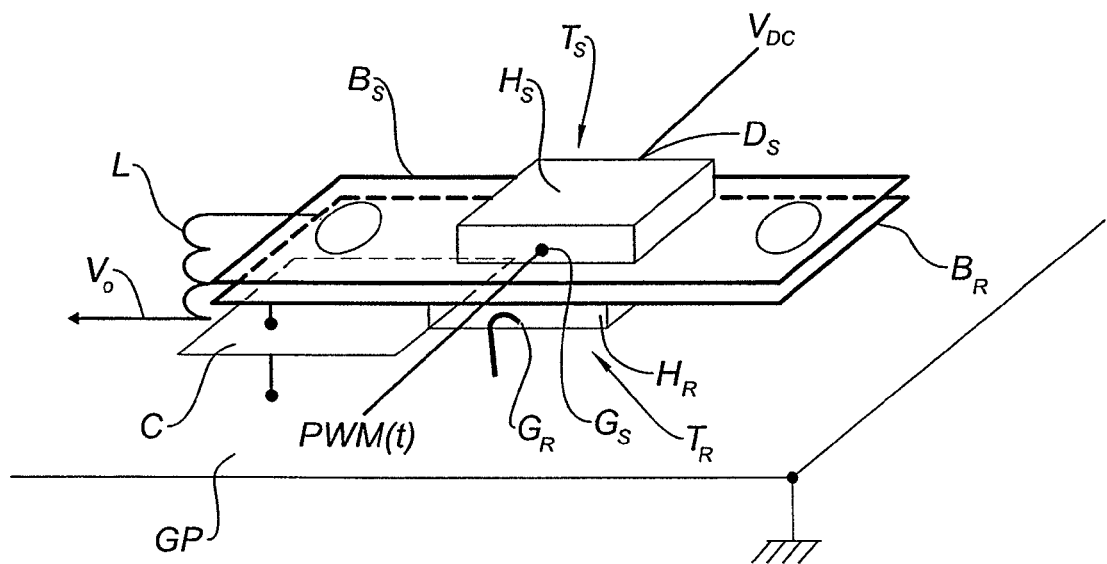

The transistors are of the same kind as those of the circuit of FIGS. 3, 4A, and 4B.

Figure 9B:
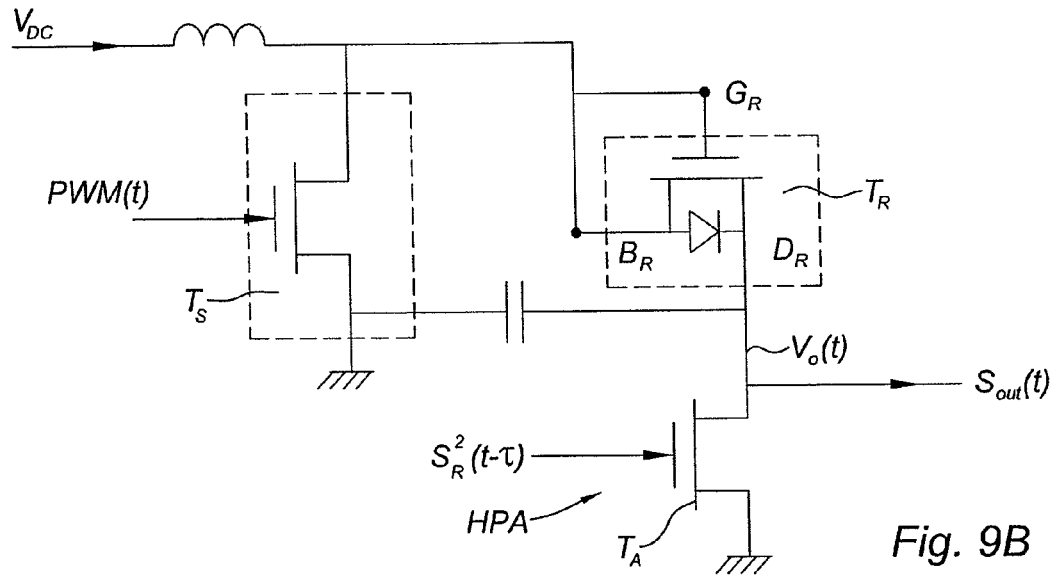
FIGS. 9A and 9B, the circuit diagrams of amplifiers according to a third and a fourth embodiments of the invention.
Figure 9A:
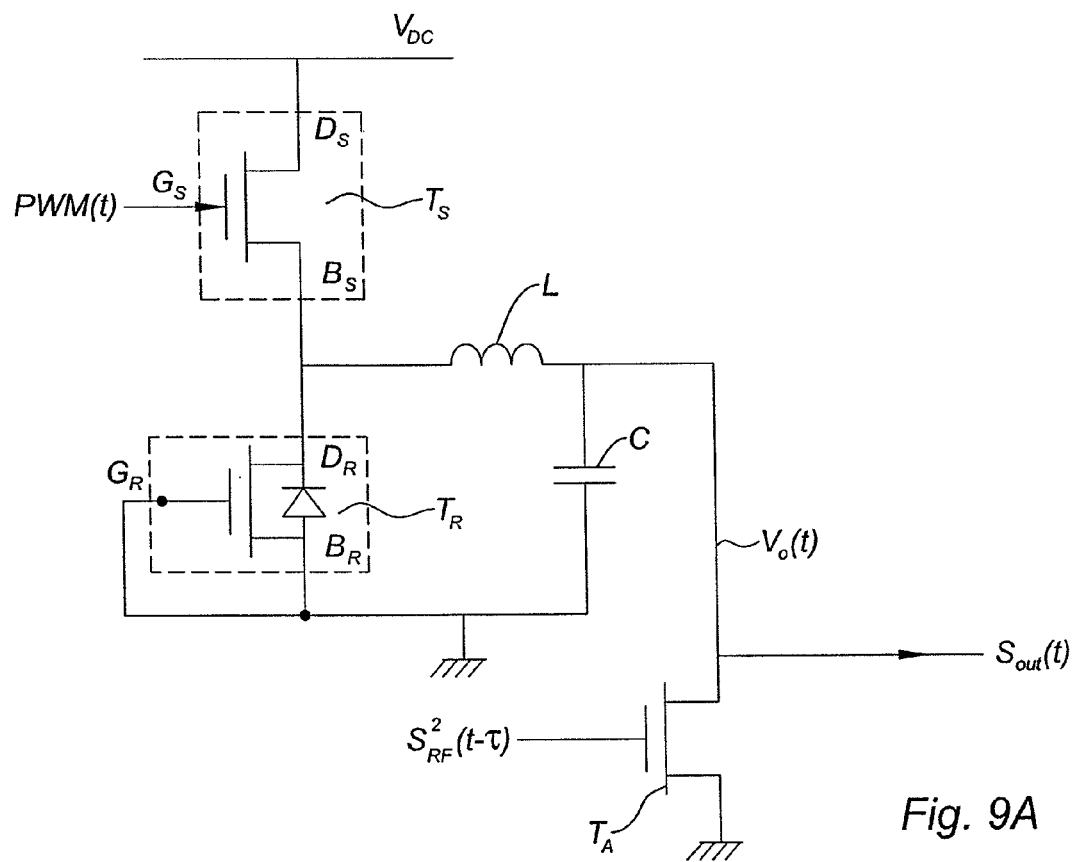

FIG. 9B shows the topology of an amplifier based on a "boost" DC/DC converter and using three LDMOS transistor as switching device, rectifier and amplifying device. Also in this case, the source and the gate of the rectifying transistor $T_R$ are connected together to form an anode of a rectifier, while the drain forms a cathode of said rectifier.

Again, the circuits of FIGS. 5 and 9B can be implemented in MMIC technology or in discrete form.

Like for the "buck" topology, the use of transistors $T_S$, $T_R$ of a same technology (other than LDMOS) allows a particularly compact implementation of the switching cell using discrete components. This implementation illustrated on FIGS. 6A ("front view") and 6B ("back view"). The same references refer to the same elements as in FIGS. 4A and 4B. It will be noted that the two base plates $B_R$, $B_S$ are not in direct mechanical and electrical contact with each other; instead, ceramic capacitor C is sandwiched between them. Again, the compactness of this assembly is apparent. In this case, the implementation proposed in FIGS. 6A and 6B for a boost topology allows removing any parasitic wire between $T_S$, the Capacitor C and $T_R$, to achieve even higher switching frequencies.

Two exemplary embodiments based on "buck" and "boost" converters have been described in detail; however it should been understood that any switching DC/DC converter topology can be applied to the invention.

Figure 6A:
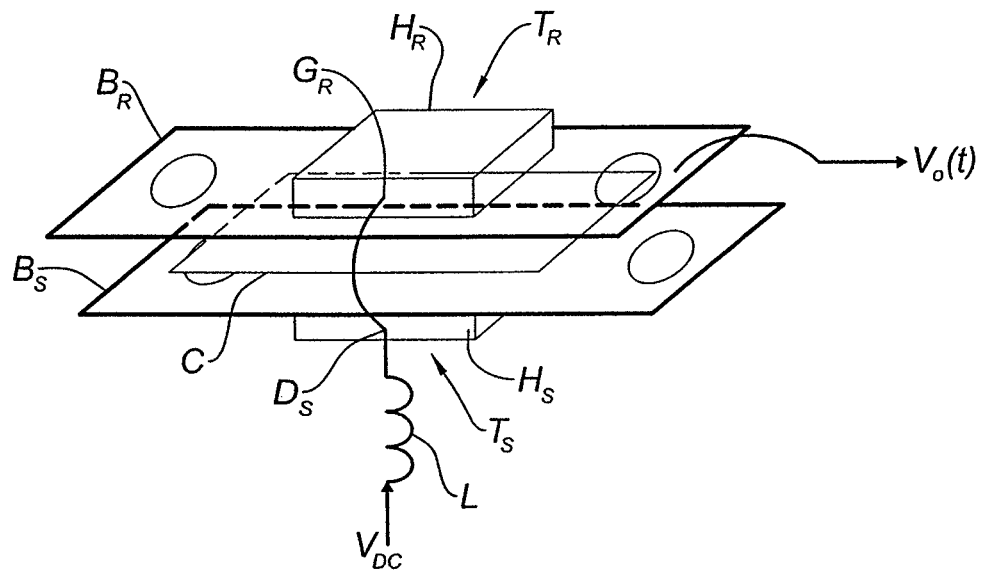
FIGS. 6A and 6B, two views of an exemplary discrete implementation of the amplifier of FIG. 5.
Figure 6B:
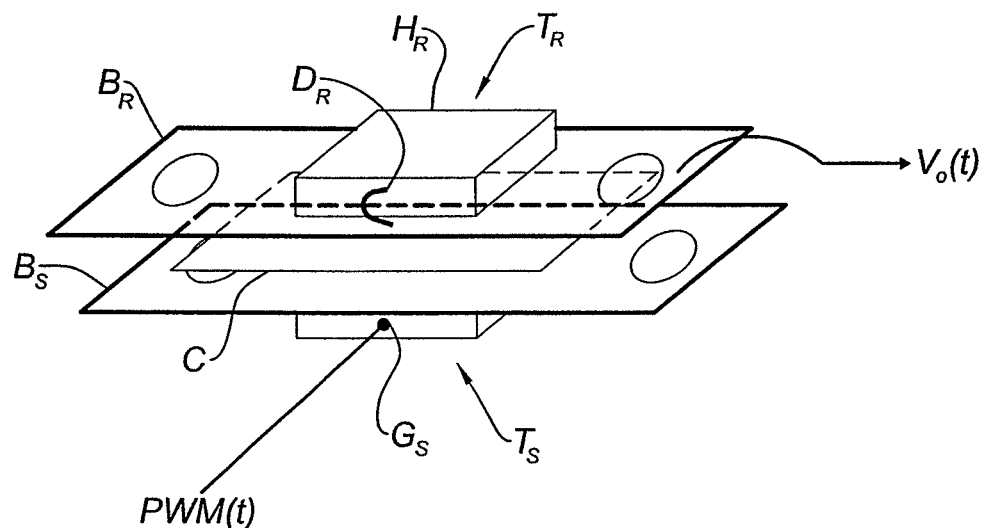
Figure 7A:
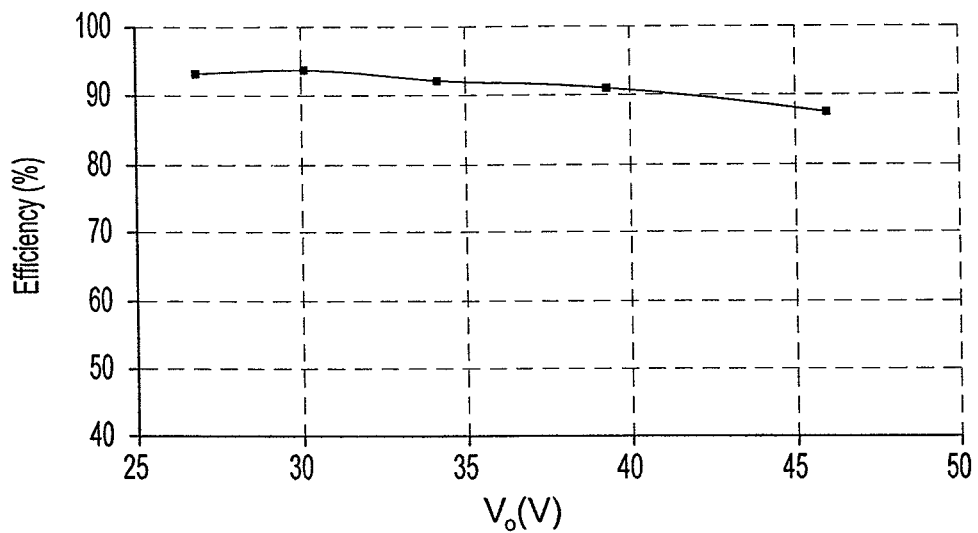
FIGS. 7A and 7B, two plots illustrating the power efficiency of the DC/DC converter of the amplifier of FIGS. 5-6B.
Figure 7B:
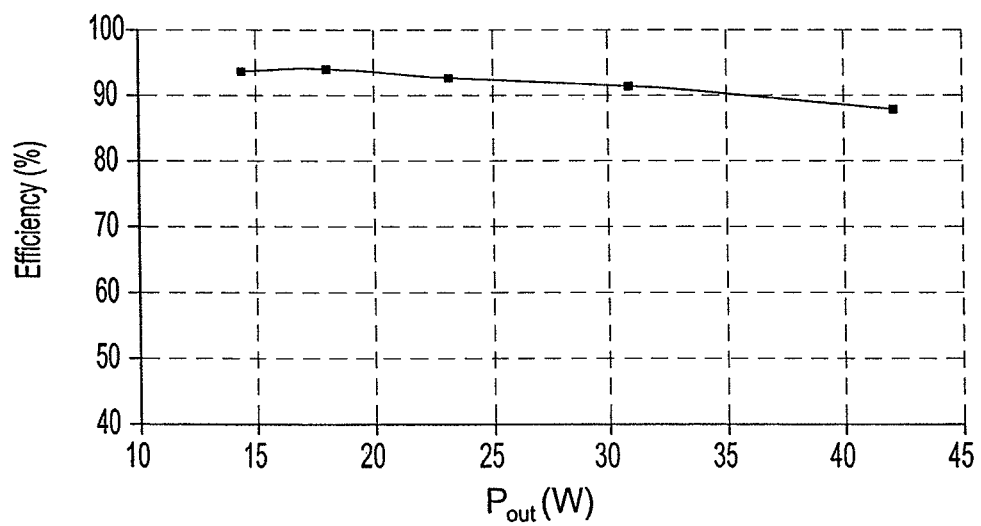

FIGS. 7A and 7B illustrates the input to output efficiency for the boost converters of FIGS. 5, 6A, 6B as a function of output voltage $V_0$ and output power $P_{out}$. The voltage supply $V_{DC}$ is 15V and the switching frequency is 10 MHz, which is a very high value compared to that of conventional DC/DC converters. Efficiency is comprised between 87 and 92% over a wide range of output power values (14-42 W), which is satisfying for envelope tracking applications. Additional breadboard work has shown that the same topology with the same components allows similar efficiency performance (less than a reduction by 2 percentage points) when operated at 50 MHz switching frequency.

A switching frequency of 10 MHz might seem insufficient for large bandwidth application. Indeed, as it has been discussed above, the switching frequency of the DC/DC converter is usually at least five times larger than the envelope bandwidth E(t). Then, if a switching frequency of 10 MHz is used and the RF signal to be amplified has a bandwidth which exceeds 2 MHz, bandwidth reduction must be performed in the tracking path of the amplifying system. This is the role of low-pass filter LPF of FIG. 2. Bandwidth reduction turns out to be compatible with efficient envelope tracking.

Figure 8A:
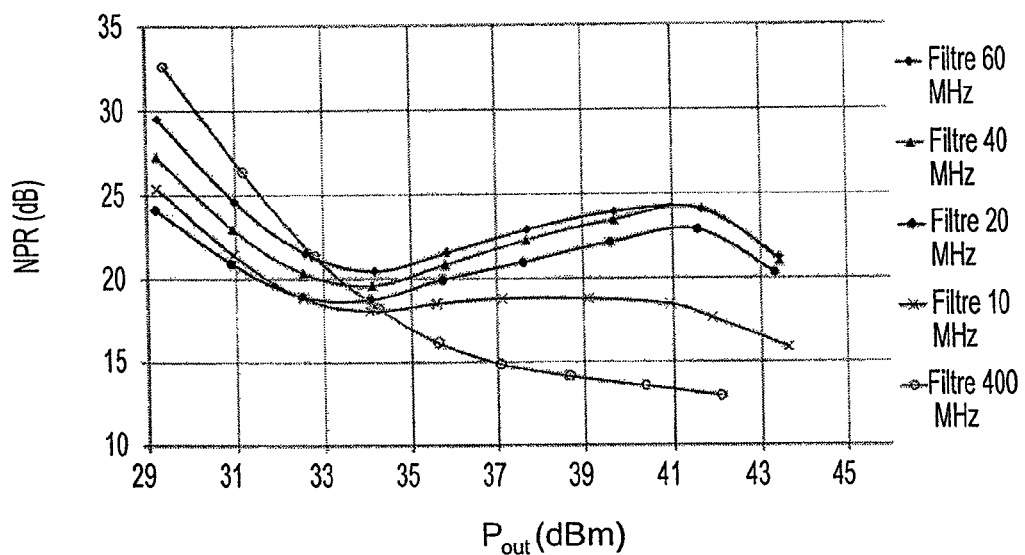
FIGS. 8A and 8B, two plots illustrating the influence of the envelope bandwidth used to drive the DC/DC converter on the performances of an amplifier according to an embodiment of the invention.
Figure 8B:
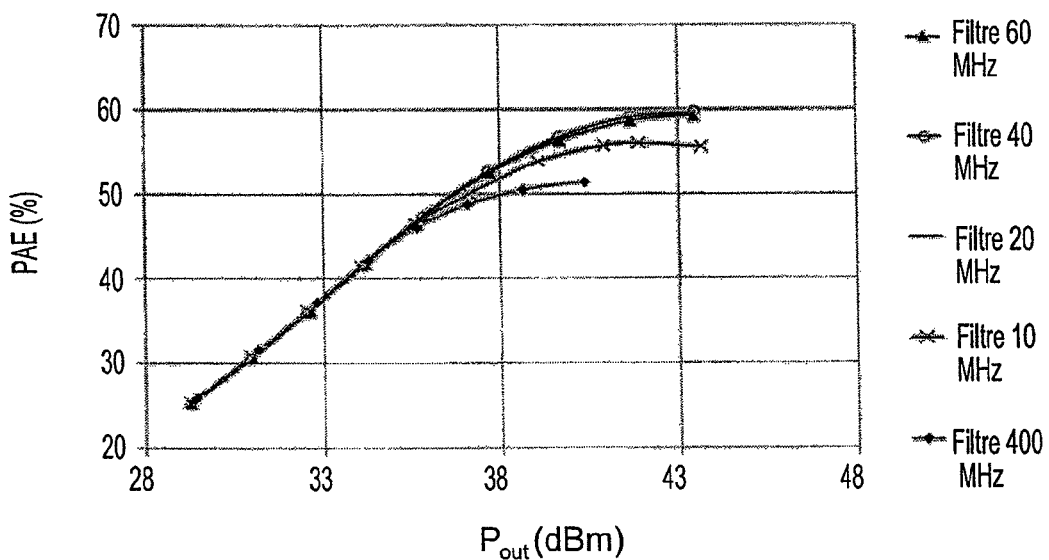

Simulations have been performed for a GaN HEMT amplifier excited by a 3000 carrier signal centered at 2.185 GHz with a channel bandwidth of 36 MHz. The cut-off frequency of the low pass filter LPF in the envelope-tracking path is gradually reduced from 60 MHz to 400 kHz. FIGS. 8A and 8B show the noise power ratio (NPR) and power added efficiency (PAE) as a function of frequency for filter having a cutoff frequency of 60 MHz, 40 MHz, 20 MHz, 10 MHz and 400 kHz.

PAE is maintained at 55% when the envelope signal is low-pass filtered with a comparatively narrow bandwidth of 10 MHz, and NPR remains above 15 dB. A 73% bandwidth reduction of the envelope signal makes the PAE only 5 points lower, the envelope modulator signal does not need having exactly the same bandwidth as the RF input envelope signal. A 10 MHz bandwidth for the envelope tracking circuit can easily be achieved with a switching frequency of 50 MHz, allowing in-turn to control the operation $V_O$ of the HPA fed with a 36 MHz bandwidth microwave modulated signal.

The invention claimed is:

1. A radio-frequency power amplifier with envelope tracking, comprising:
    a power RF amplifying device ($T_A$) for amplifying a RF signal; and
    a switching DC/DC converter (DCC), comprising a switching ($T_S$) device and a rectifying device ($T_R$), for providing said power RF amplifying device with a DC power supply ($V_O$) at a voltage level proportional to an envelope (E) of said RF signal;
    wherein said switching device is a RF power transistor;
    characterized in that said rectifying device is also a transistor of a same technology, connected as a two-terminal device;
    and in that said switching device and rectifying device are discrete transistors mounted on respective metal support plates ($B_S$, $B_R$) in electrical connection with their sources or emitters, said metal support plates being mounted face to face, either in direct electrical contact or connected through a capacitor (C) sandwiched between them.

2. The radio-frequency power amplifier according to claim 1 wherein said switching device, said rectifying device and said power RF amplifying are all transistors of a same technology.

3. The radio-frequency power amplifier according to claim 2, wherein said power RF amplifying device, said switching device and said rectifying device are identical transistors.

4. A radio-frequency power amplifier with envelope tracking, comprising:
    a power RF amplifying device ($T_A$) for amplifying a RF signal; and
    a switching DC/DC converter (DCC), comprising a switching ($T_S$) device and a rectifying device ($T_R$), for providing said power RF amplifying device with a DC power supply ($V_O$) at a voltage level proportional to an envelope (E) of said RF signal;
    wherein said switching device is a RF power transistor;
    characterized in that said rectifying device is also a transistor of a same technology, connected as a two-terminal device;
    and in that said switching device and rectifying device are transistors mounted on metal support plates ($B_S$, $B_R$) in electrical connection with their sources or emitters, said metal support plates being mounted face to face, either in direct electrical contact or connected through a capacitor (C) sandwiched between them;
    wherein said power RF amplifying device, said switching device and said rectifying device are all transistors of a same technology;
    wherein said power RF amplifying device, said switching device and said rectifying device are high-electron mobility transistors; and wherein the gate ($G_R$) of the transistor used as a rectifier device is connected to a first terminal while the drain ($D_R$) and source ($D_S$) of said transistor are connected together to a second terminal.

5. The radio-frequency power amplifier according to claim 4, wherein said power RF amplifying device, said switching device and said rectifying device are chosen in the group comprising:
    Gallium Nitride High Electron Mobility Transistors; and
    Gallium Arsenide High Electron Mobility Transistors.

6. A radio-frequency power amplifier with envelope tracking, comprising:
    a power RF amplifying device ($T_A$) for amplifying a RF signal; and
    a switching DC/DC converter (DCC), comprising a switching ($T_S$) device and a rectifying device ($T_R$), for providing said power RF amplifying device with a DC power supply ($V_O$) at a voltage level proportional to an envelope (E) of said RF signal;
    wherein said switching device is a RF power transistor;
    characterized in that said rectifying device is also a transistor of a same technology, connected as a two-terminal device;
    and in that said switching device and rectifying device are transistors mounted on metal support plates ($B_S$, $B_R$) in electrical connection with their sources or emitters, said metal support plates being mounted face to face, either in direct electrical contact or connected through a capacitor (C) sandwiched between them;
    wherein said power RF amplifying device, said switching device and said rectifying device are all transistors of a same technology;
    wherein said power RF amplifying device, said switching device and said rectifying device are Heterojunction Bipolar Transistors; and wherein the base of the transistor used as a rectifier device is connected to a first terminal while the collector and emitter of said transistor are connected together to a second terminal.

7. A radio-frequency power amplifier with envelope tracking, comprising:
    a power RF amplifying device ($T_A$) for amplifying a RF signal; and
    a switching DC/DC converter (DCC), comprising a switching ($T_S$) device and a rectifying device ($T_R$), for providing said power RF amplifying device with a DC power supply ($V_O$) at a voltage level proportional to an envelope (E) of said RF signal;
    wherein said switching device is a RF power transistor;

characterized in that said rectifying device is also a transistor of a same technology, connected as a two-terminal device;

and in that said switching device and rectifying device are transistors mounted on metal support plates ($B_S$, $B_R$) in electrical connection with their sources or emitters, said metal support plates being mounted face to face, either in direct electrical contact or connected through a capacitor (C) sandwiched between them;

wherein said power RF amplifying device, said switching device and said rectifying device are Laterally Diffused Metal Oxide Semiconductor transistors; and wherein the gate ($G_R$) and the source the source ($D_S$) of the transistor used as a rectifier device are connected together to a first terminal and the drain ($D_R$) of said transistor is connected to a second terminal.

8. The radio-frequency power amplifier according to claim 1, wherein said switching device and said rectifying device have a switching speed greater or equal than 5 MHz and are able to handle a current greater or equal than 1 A.

9. The radio-frequency power amplifier according to claim 1, comprising no linear envelope tracking stage.

10. The radio-frequency power amplifier according to claim 1, further comprising a driving circuit (PWD) for driving said switching device with a PWM signal representative of an envelope of the RF signal to be amplified.

11. The radio-frequency power amplifier according to claim 10, further comprising a low-pass filter (LPF) for reducing the bandwidth of the envelope signal on which the PWM signal driving the DC/DC converter depends.

* * * * *